United States Patent [19]

Cope et al.

[11] Patent Number: 4,903,343
[45] Date of Patent: Feb. 20, 1990

[54] MAGNETIC DIGITAL DATA STORAGE SYSTEM

[75] Inventors: David B. Cope, Medfield; Gary J. Spletter, Winthrop, both of Mass.

[73] Assignee: MRAM, Inc., Medfield, Mass.

[21] Appl. No.: 299,304

[22] Filed: Jan. 23, 1989

[51] Int. Cl.$^4$ .............................................. G11C 11/08
[52] U.S. Cl. ........................................ 365/91; 365/84; 365/92
[58] Field of Search ....................... 365/91, 92, 144, 84

[56] References Cited

U.S. PATENT DOCUMENTS

| | | | |
|---|---|---|---|
| 2,978,176 | 4/1961 | Lockhart | 365/91 |
| 3,184,722 | 5/1965 | Franks, Jr. | 365/91 |
| 4,192,013 | 3/1980 | Keats et al. | 365/91 |

OTHER PUBLICATIONS

The Bell System Technical Journal—Jan. 1959, pp. 45–72.

Primary Examiner—James W. Moffitt
Attorney, Agent, or Firm—Fish & Richardson

[57] ABSTRACT

A new data storage device that includes one or more digital data storage elements, each element including a magnetic core, and an input addressing portion comprising a magnetic input addressing element for receiving at an input magnetic flux representing a data value and selectively coupling a flux to an output for transmission to a magnetic core in response to addressing flux generated therein. An output element magnetically coupled to a magnetic core detects transitions in magnetic flux in a magnetic core. In addition, the data storage element may further comprise an output addressing portion comprising a magnetic input addressing element for receiving at an input magnetic flux representative of flux in a magnetic core and selectively coupling a flux to an output in response to addressing flux generated therein.

18 Claims, 2 Drawing Sheets

MAGNETIC DIGITAL DATA STORAGE SYSTEM

BACKGROUND OF THE INVENTION

The invention relates generally to the field of digital data processing systems, and more particularly to data storage devices for use in such systems.

In digital data processing systems, that is, computer systems, digital data is stored in a data storage device, such as a memory, which typically comprises a large number of storage locations, each of which is identified by an address. Digital data comprises a plurality of binary data digits, known as bits, that are organized into addressable units of eight-bit bytes, sixteen-bit words, and so forth, with each unit being stored in an addressable storage location. In prior computer systems, the data was stored magnetically, with each data bit being stored in a core, that is, a toroid of magnetic material. The value of the data bit stored in the core was represented by the direction of the magnetization in the core, that is, the direction of the magnetic flux maintained in the core. While core memories were typically relatively bulky, they did maintain their data when power was turned off or during power failures.

In a typical magnetic data storage system, the magnetic cores comprising the system were addressed using a coincident current arrangement. In such an arrangement, the cores were arranged in array of rows and columns, with wires extending through the cores down each column and across each row. To write data into, or read data from a particular core, the wires associated with the core's row and column were energized by applying an electric current to them. The amount of current in both wires was sufficient to alter the magnetization of a previously-magnetized core, and so the magnetization core in the array location associated with the intersection of the wires was adjusted by the currents. However, the current in each energized wire was insufficient to alter the magnetization of a previously magnetized core, and so the magnetizations of the other cores in the row and column associated with the wires are unchanged. The arrangement of the cores in the array effectively operated as an addressing mechanism, since a single bit in an array could be selected by appropriate selection of a wire associated with the core's column and a wire associated with the core's row.

More recently, data storage devices have incorporated, instead of magnetic cores, electronic storage devices which store data bits having data values represented by the value of the electrical charge on a capacitor. This facilitated fabrication of memories using integrated circuits, but the data stored in such devices is erased when power is turned off or during power failure.

SUMMARY OF THE INVENTION

The invention provides a new and improved data storage device for use in connection with a digital data processing system.

In brief summary, the new data storage device includes one or more digital data storage elements, each element including a magnetic storage medium, and an input addressing portion comprising a magnetic input addressing element for receiving, at an input, magnetic flux representing a data value and selectively coupling said flux to an output for transmission to said magnetic storage medium, to condition the magnetization thereof, in response to addressing flux generated therein. An output element magnetically coupled to said magnetic storage medium detects transitions in magnetic flux in said magnetic storage medium. In addition, the data storage element may further comprise an output addressing portion comprising a magnetic input addressing element for receiving, at an input, magnetic flux representative of flux in said magnetic storage element and selectively coupling said flux to an output in response to addressing flux generated therein.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

DETAILED DESCRIPTION OF AN ILLUSTRATIVE EMBODIMENT

Figure 1:
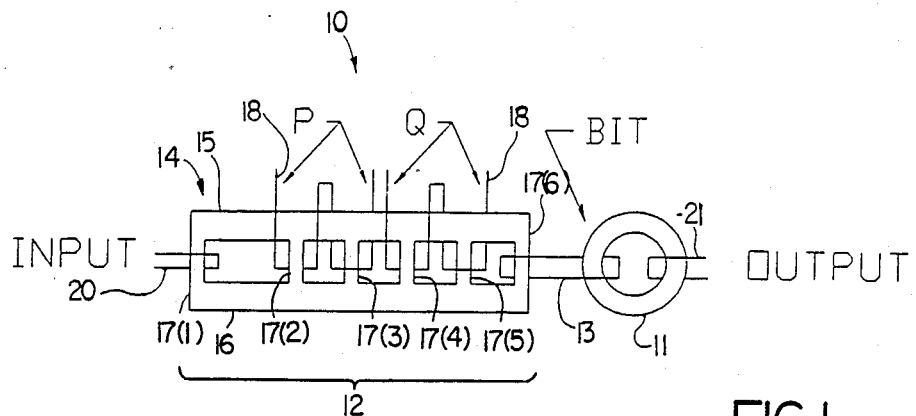
FIGS. 1 through 3 comprise schematic diagrams of digital data storage devices constructed in accordance with the invention.

FIG. 1 is a schematic diagram of a digital data storage element 10 constructed in accordance with the invention. With reference to FIG. 1, the storage element 10 includes a magnetic core 11 and an addressing portion 12 interconnected by a wire 13. The addressing portion 12, in turn, includes a laddic structure 14, which is a ladder-shaped element having two side elements 15 and 16 and a plurality of rungs 17 extending therebetween, all of which are formed from a magnetic material. The addressing portion 12 further includes a plurality of addressing wires 18 which are wound around selected rungs 17 of the laddic structure 14. The storage element 10 depicted in FIG. 1 includes two addressing wires 18, identified by letters "P" and "Q", which receive corresponding address signals that facilitate accessing the storage element to enable storage of data in, or reading of data from, the storage element 10, as described below. The storage element 10 depicted in FIG. 1 includes six rungs 17, each identified by index "1" through "6" in FIG. 1, and two addressing wires "P" and "Q", but it will be recognized that the number of addressing wires may be varied as required to uniquely identify the storage element 10 in a storage system comprising a plurality of storage elements 10, and the number of rungs 17 may be varied to accommodate the number of addressing wires required therefor.

The data to be stored in the storage element 10 is defined by a signal, in particular the direction of current comprising the signal, on an input line 20. Similarly, the data read from the storage element 10 is defined by the existence or non-existence of current comprising a signal on an output line 21. Generally, during a storage operation, current is applied by external circuitry (not shown) to the addressing wires, which generates flux in the associated rung in a direction that depends on the direction of the current and the direction that the wire is wound around the respective rung With the addressing wires P and Q wound around the rungs 17 identified by numerals 17(2) and 17(3), and 17(4) and 17(5), respectively, as depicted in FIG. 1, if signals are applied to the wires in a current counterclockwise direction, magnetic flux will be generated in the rungs 17(2) and 17(4) in a downward direction and rungs 17(3) and 17(5) in the upward direction.

As a result, a complete magnetic circuit is generated resulting from the current in addressing wire P in adjacent rungs 17(2) and 17(3) and the portion of sidewalls 15 and 16 therebetween, and a second complete magnetic circuit is generated resulting from the current in addressing wire Q in adjacent rungs 17(4) and 17(5) and the portion of sidewalls 15 and 16 therebetween. The level of current, and the dimensions and materials of the rungs 17 and side elements are selected so the flux generated in the rungs 17 and side elements substantially saturate the rungs 17(2) through 17(5) of the laddic structure 14, but not the rungs 17(1) and 17(6) or side elements 15 and 16.

While the rungs 17(2) through 17(5) are saturated, when external circuitry (not shown) thereafter applies a signal to the input line 20, magnetic flux is generated in the laddic structure 14, specifically in rung 17(1), in response to the signal, and is coupled through the side elements 15 and 16 past the saturated rungs to the rung 17(6) at the distal end of the laddic structure 14. If, for example, the current in the input line 20 is in the clockwise direction, flux will be generated in the rung 17(1) in an upward direction. To complete the magnetic circuit, flux must also be generated in another rung 17, as well as the side elements 15 and 16 therebetween. Since the first unsaturated rung after rung 17(1) is distal rung 17(6), the magnetic flux generated in response to the input signal on input line 20 travels along the side elements 15 and 16 to that rung 17(6). At that rung, the flux will have a downward direction, as shown in FIG. 1. Thus, flux resulting from the input signal will effectively have a clockwise direction in the laddic structure 14. If the current comprising the input signal has the opposite direction, the flux resulting therefrom will also have the opposite direction.

When the flux due to the input signal on input wire 20 reaches the distal rung 17(6), it is transformed into an electrical pulse signal in the wire 13 interconnecting the laddic structure 14 and the core 11. More specifically, if the flux changes direction from its previous direction in the distal rung 17(6), the change in direction results in generation of an electrical pulse signal in the wire 13, with the direction of current comprising the signal depending on the original and resulting flux directions. The pulse signal in wire 13, in turn, generates a magnetic flux in the core 11, with the direction of flux in the core 11 depending on the direction of current comprising the pulse signal.

The particular value of the data stored in the storage element 10 during a storage operation depends on the direction of magnetic flux in the magnetic core 11. Since the magnetic flux in the magnetic core 11 may have one of two directions, that is, either clockwise or counterclockwise as shown in FIG. 1, the digital data stored in the storage element may comprise one of two digital values. The direction of the magnetic flux in the magnetic core 11 is controlled by the direction of flow of the current comprising the signal applied to the input line 20. As noted above, the direction of the current comprising the signal on the input line 20 in turn determines the direction of the magnetic flux which flows through the side elements 15 and 16 and distal rung 17(6) at the distal end of the laddic structure 14. The direction of the flux in that rung, in turn, determines the direction of current flow through the wire 13, which, finally, determines the direction of magnetic flux generated in magnetic core 11. Thus, the value of the data bit in the storage element 10, which is defined by the direction of magnetic flux in the magnetic core 11, is controlled by the direction of the current defining the signal on input wire 20.

During a reading operation, in which the value of digital data previously stored in the storage element 10 is read to be used by external processing circuitry (also not shown), the storage element 10 is accessed by energizing all of its address wires 18, as described above, to saturate the rungs 17(2) through 17(5), and a signal is applied to input line 20. The current comprising the signal applied to input line 20 is in a known predetermined direction, which corresponds to one of the two possible digital values which the digital data may comprise. In response to the current, magnetic flux is generated in the laddic structure 14, in the same manner as during a storage operation, which is transformed, over wire 13, to the magnetic core 11. If the flux applied to the magnetic core 11 is in the opposite direction as the flux previously applied to the magnetic core 11, the direction of the flux flips to the newly-applied direction, which, in turn, generates a signal in output line 21. On the other hand, if the flux applied to magnetic core 11 is in the same direction as was applied during a preceding storage operation, the direction of flux does not change, and so no significant signal is generated in output line 21.

Thus, the value of the digital data stored in the storage element 10 determined during a read operation is identified by the presence or absence of a signal on the output line 21. If no significant signal is generated on the output line 21 during a read operation, the value of the digital data corresponds to that associated with the direction of the signal on input line 20. On the other hand, if a signal is generated on the output line 21, the value of the digital data stored in the storage element 10 is the other of the two possible digital values.

As is apparent, during a reading operation, the value of the data stored in the storage element may be changed. In particular, if the signal on input line 20 enables the flux of magnetic core 11 to be changed, during a reading operation, such that a signal is generated in output line 21, the digital data in the storage element 10 after the reading operation does not have the same value which it had prior to the reading operation. In that case if it is desired to restore the digital data stored in the storage element 10 to the same value as prior to the reading operation, external circuitry (not shown) performs a storage operation, as described above, to store the value in the storage element 10.

As described above, if signals are applied to all of the addressing wires 18 of the addressing portion 12 of the storage device 10, a signal on the input wire 20 is reflected in the rung 17(6) at the distal end of the laddic structure 14, thereby permitting a storage operation or a reading operation to be performed in connection with the storage element 10. If, on the other hand, no current is applied to one or more of the addressing wires 18 in the addressing portion 12 of the storage element 10, the rung or rungs 17 associated with those addressing wires 18 do not saturate. In that condition, the magnetic flux generated in the addressing portion 12 in response to a signal on the input wire 20 is shunted through the unsaturated rungs and does not reach the distal rung 17(6), thereby ensuring that no significant electrical signal is generated in wire 13, so that no storage operation or reading operation is performed in connection with the storage element 10. Thus, a storage element 10 in an array of storage elements may be selected by application of current to all of the addressing wires 18 included in the storage element 10.

Figure 2:
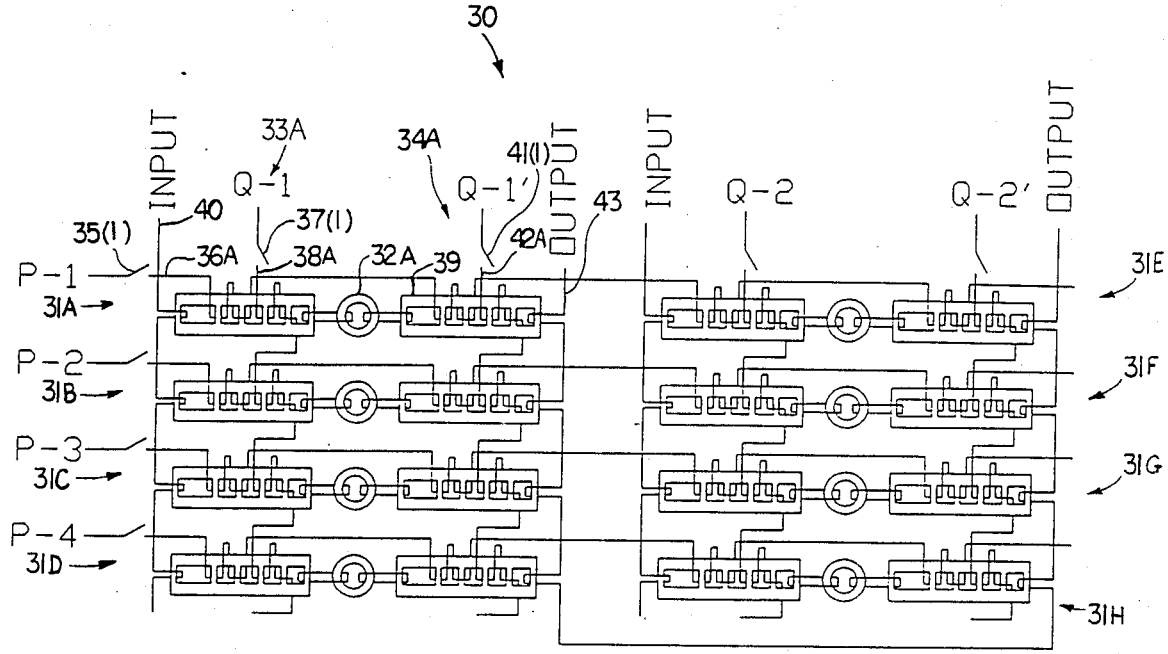

FIG. 2 depicts a storage array 30 including a plurality of storage elements 31(A) through 31(H) (generally identified by reference numeral 31), with each storage element 31 including portions generally similar to the storage element depicted in FIG. 1. (The array 30 depicted in FIG. 2 includes eight storage elements 31, but it will be appreciated from the following that the storage array 30 may comprise any number of storage elements 31.) The storage array is addressed by a number of address signals identified by "P-1" through "P-4", "Q-1", "Q-1'", "Q-2", and "Q-2'". Since all of the storage elements 31 are generally similar, only one storage element, namely, storage element 31A, will be described in detail. Storage element 31A includes a magnetic core 32A connected to an input addressing portion 33A and an output addressing portion 34A.

The input addressing portion 33A in combination with storage element 31A is similar to, and operates as described above in connection with, the storage element 10 depicted in FIG. 1. The input addressing portion 33A receives addressing signal "P-1" which is selectively coupled through a switch 35(1) onto an address line 36A, and a second addressing signal "Q-1" which is selectively coupled through a second switch 37(1) onto an address line 38A. The input addressing portion 33A also receives an input signal on an input line 40 which is common to the input addressing portions 33 of all of the storage elements 30, and if the "P-1" and "Q-1" addressing signals are being applied to the respective address lines 36A and 38A, the input signal on line 40 generates magnetic flux in the input addressing portion 33A which conditions the direction of magnetic flux in the storage element 32A.

The output addressing portion 34A includes a laddic structure 39 which receives, as an input, a connection from the storage element 32A. The output addressing portion, and particularly the laddic structure 39, also receives the addressing signal "P-1" selectively coupled through the switch 35(1) onto address line 36A, and a second addressing signal "Q-1," selectively coupled through a switch 41(1) onto an address line 42A. The output addressing portion 34A also transmits, as described below, an output signal onto an output line 43 which is common to all of the storage elements 30.

The operation of the output addressing portion 34A is similar to that described above in connection with the addressing portion 12 of the storage element 10 in FIG. 1. That is, the "P-1" and "Q-1," addressing signals operate as the addressing signals for the output addressing portion 34A, and a signal from the connection to the magnetic core 32A operates as the input signal for the output addressing portion 34A. That is, if the "P-1" and "Q-1," signals are asserted, a signal from the storage element 32A, which is generated in response to the flip of magnetic flux in the magnetic core 32A, generates flux in the laddic structure 39, which, in turn, enables generation of a signal in the output line 43.

Storage of data in the storage element 31A, whose value is indicated by the direction of magnetic flux in the magnetic core 32A, is accomplished in a similar manner as described above in connection with FIG. 1. That is, to store data in the storage element 31A, external circuitry (not shown) generates appropriate address signals "P-1" and "Q-1", through the respective switches 35(1) and 37(1), which generate flux in the respective rungs of the laddic structure of the input addressing portion 33A. The external circuitry thereafter generates the input signal and applies it to the common input signal line 40. The direction of current comprising the input signal reflects the value of the data to be stored in the storage element 31A. In response to the input signal, magnetic flux is generated in the laddic structure of the input addressing portion 33A, the direction of the flux being determined by the direction of the current forming the input signal. The magnetic flux in the laddic structure of the input addressing portion 33A is coupled to the magnetic core 32A over the connection therebetween, with the direction of flux in the core 32A being determined by the direction of flux in the input addressing portion 33A.

The reading of data previously stored in the storage element 31A is also accomplished in a similar manner as described above in connection with FIG. 1, with the addition that the external circuitry (not shown) also generates the appropriate address signal "Q-1'", in addition to the address signals "P-1" and "Q-1", through the respective switches 35(1), 37(1) and 41(1), and provides an input signal on line 40 having a predetermined direction corresponding to one of the two possible values of the data which may be stored in the storage element 31A.

As described above in connection with FIG. 1, if the value of the data stored in the storage element 31A corresponds to the complement of the value represented by the input signal, the direction of the magnetic flux of the magnetic core 32A is flipped, which generates a signal on line 21 (FIG. 1) which, in turn, generates magnetic flux in the laddic 39 of the output addressing portion 34A. Since the "P-1" and "Q-1'" addressing signals are both being generated, the magnetic flux is coupled to the rung surrounded by the output signal line 43, generating an output signal therein. A storage operation may, if desired, thereafter be initiated to restore the magnetic core 32A to its condition prior to the reading operation, as described above in connection with FIG. 1.

On the other hand, if the value of the data stored in the storage element 31A corresponds to the value represented by the input signal, the direction of the magnetic flux of the magnetic core 32A is not flipped, and no signal is generated for coupling to the laddic 39 of the output addressing portion 34A. In that condition, no signal is generated on the output signal line 43.

The use of an input addressing portion, such as portion 33A, and a separate output addressing portion, such as portion 34A, is particularly advantageous in connection with a storage array including a plurality of storage elements each of whose magnetic cores, such as magnetic core 32A, may be shared, so that a single magnetic core may be connected to a plurality of input addressing portions and a like plurality of output addressing portions. In that case, each input addressing portion and corresponding output addressing portion may be controlled by distinct external circuitry, such as a digital data processor, which enables data to be stored in the storage element and which thereafter uses the data stored therein. Such an arrangement is depicted in FIG. 3.

Figure 3:
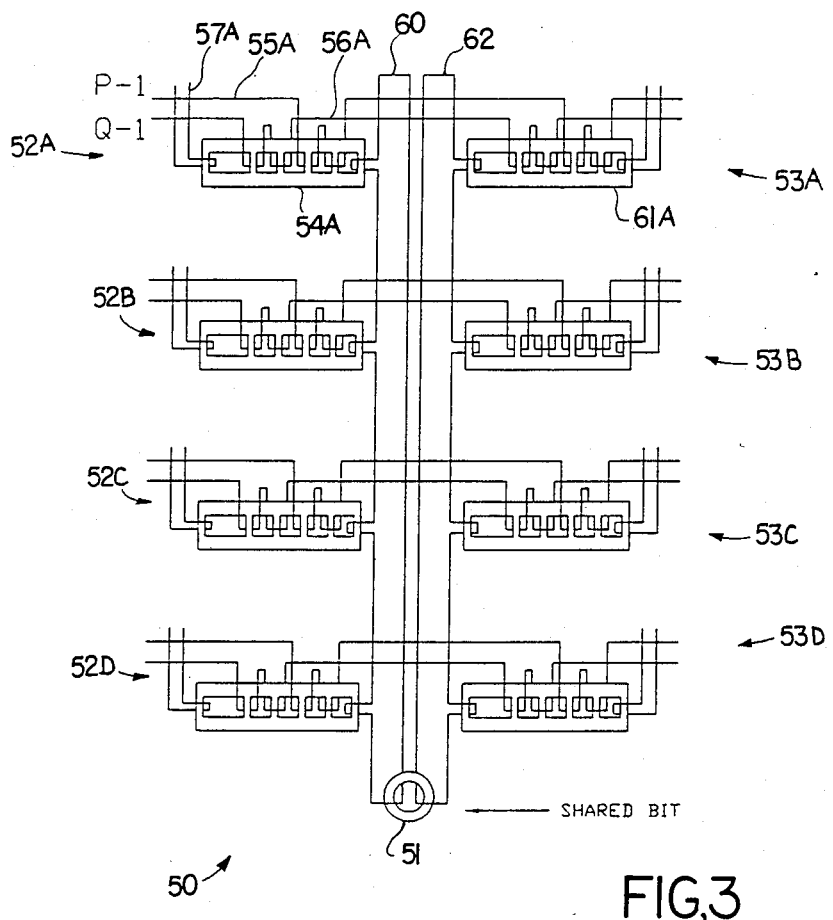

FIG. 3 depicts a storage element 50 which includes a single magnetic core 51 controlled by a plurality of input addressing portions 52A through 52D (generally identified by reference numeral 52) and a like plurality of output addressing portions 53A through 53D (generally identified by reference numeral 53). Each input addressing portion 52 and associated output addressing portion 53 is controlled by external circuitry (not shown) such as a processor, that is, input addressing portion 52A and output addressing portion 53A are controlled by a processor executing a particular task, or by other external circuitry, input addressing portion 52B and output addressing portion 53B are controlled by a processor which may be executing the same task or a different task, or by other external circuitry, and so forth. The storage element 50 thus facilitates sharing of data stored in the core 51 among, for example, a plurality of processors which may be executing the same process or different processes.

The associated input addressing portions 52 and output addressing portions 53 are similar, and so only input addressing portion 52A and output addressing portion 53A will be described in detail. The input addressing portion 52A includes a laddic structure 54A and a plurality of address input wires around associated rungs of the laddic structure. Tee embodiment depicted in FIG. 3 includes two address input wires 55A and 56A for carrying address signals "P-1" and "Q-1" provided by the external circuitry (not shown) controlling the input address portion. As is the case with the embodiment depicted in FIG. 1, the storage element may include any number of address signals, associated address input wires, and appropriate additional rungs 17, in connection with both the input addressing portions 52 and output addressing portions 53 as may be required to identify the input and output addressing portions in a storage system including the storage element. It will be appreciated that the address signals identify the input and output address portions, and not necessarily the particular core, so that multiple combinations of address signals, which may be controlled by different processors and/or tasks may individually access the core 51.

In addition, the external circuitry provides an input signal on an input line 57A which is around a rung of the laddic structure 54A. A wire 60 magnetically couples the laddic structure 54A to the common magnetic core 51. Wire 60 is common to all input addressing portions 52 and controls the direction of magnetic flux in the magnetic core 51. The output addressing portion also includes a laddic structure 61A having a rung around which is positioned a wire 62 which magnetically couples the magnetic core 51 to the laddic, address input wires 55A and 56A, and an output wire 63A which couples an output signal from the output addressing portion to external utilization circuitry (not shown).

The operation of the storage element 50 depicted in FIG. 3, that is, the operation by which data is stored in or read from the magnetic core 51, is similar to that described above in connection with FIG. 2, with the addition that the value of the data stored in the magnetic core 51 during a storage operation is a function of the values of the data represented by the input signals on all of the input lines 57 of all of the input address portions 52A through 52D which receive the appropriate address signals. During a reading operation, a signal representing the data stored in the magnetic core 51, which is determined by the direction of magnetic flux in the core 51, may be selectively coupled through one or more of the output addressing portions 53, as determined by the respective address signals on lines 55 and 56. Thus, the data in the magnetic core 51 may be read by one or more of the processors, or other external circuitry, simultaneously. In addition, since the output addressing portions 53 of each storage element 50 effectively inhibit signals reflecting the value of the data stored in the element's magnetic core 51 from reaching the external circuitry that is not addressing the storage element, the contents of multiple storage elements may be read simultaneously by the external circuitry or processors.

In the embodiment depicted in FIG. 3, each of the addressing wires 55(a) and 56(a) is shown controlling both the input address portion 52(a) and the output address portion 53(a), it will be appreciated that one or both of the addressing wires may only address the input address portion 52(a), and one or more further address wires (not shown) be used to control the output address portion 53(a), as in the embodiment depicted in FIG. 2. In that case, one processor or task can input data to the core 51, at the same time that another processor or task can read the data or determine when a change occurs in the state of the data represented by the flux in the core 51.

Storage elements depicted schematically in FIGS. 1 through 3, and storage arrays comprising a plurality of storage elements, may be constructed of discrete elements or may alternatively be constructed in monolithic form using thin-film or similar techniques.

The foregoing description has been limited to a specific embodiment of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed as new and desired to be secured by Letters Patent of the United State is:

1. A digital data storage element comprising:
A. a magnetic core;
B. an input addressing portion comprising:
   i. a laddic-shaped input addressing element having a pair of sidebars and plurality of rungs including an input rung, at least one addressing rung, and a distal rung;
   ii. an input wire magnetically coupled to said input rung for generating an input flux signal in said addressing element having a direction related to a digital data value;
   iii. an enabling wire magnetically coupled to said distal rung and said magnetic core for coupling magnetic flux from said distal rung to said magnetic core to generate flux in the magnetic core having a direction reflecting said digital data value;
   iv. an input addressing wire magnetically coupled to said addressing rung for selectively receiving current to generate magnetic flux in said addressing rung to control coupling of said input flux signal at said input rung to said distal rung for coupling by said enabling wire, the level of said current and the respective dimensions and materials of the addressing rung, said input rung, said distal rung and said sidebars being selected so that the flux generated in the addressing rung substantially saturates the addressing rung, but not the input rung, the distal rung and the sidebars; and
C. an output element magnetically coupled to said magnetic core that detects transitions in magnetic flux in said magnetic core.

2. A storage element as defined in claim 1 in which said output element includes an output addressing portion comprising:
   i. a laddic-shaped output addressing element having a plurality of rungs including an input rung, at least one output addressing rung, and an output rung,
   ii. an input wire magnetically coupled to said magnetic core and said input rung for generating an input flux signal in said output addressing element;
   iii. an output wire magnetically coupled to said output rung; and
   iv. an output addressing wire magnetically coupled to said output addressing rung for selectively controlling coupling of said input flux signal at said input rung to said output rung for coupling by said output wire.

3. A storage element as defined in claim 2 in which said output addressing element includes a plurality of output addressing rungs, said output addressing portion including a like plurality of output addressing wires each magnetically coupled to one of said output addressing rungs for selectively controlling coupling of said input flux signal at said input rung of s id output addressing element to its output rung.

4. A storage element as defined in claim 3 wherein said input addressing element includes a plurality of input addressing rungs, said input addressing portion including a like plurality of input addressing wires each magnetically coupled to one of said input addressing rungs for selectively controlling coupling of said input flux signal at said input rung to said distal rung.

5. A storage element as defined in claim 4 wherein at least some of said input addressing wires are associated with respective ones of said output addressing wires.

6. A storage element as defined in claim 2 comprising a plurality of input addressing portions and a like plurality of output addressing portions, each input addressing portion having an enabling wire for coupling magnetic flux to said magnetic core and each output addressing portion having an input wire for receiving an input flux signal from said magnetic core.

7. A digital data storage element comprising:
   A. a magnetic core;
   B. a plurality of input addressing portions each comprising:
      i. a laddic-shaped input addressing element having a plurality of rungs including an input rung, at least one addressing rung, and a distal rung;
      ii. an input wire magnetically coupled to said input rung for generating an input flux signal in said addressing element having a direction related to a digital data value;
      ii. an enabling wire magnetically coupled to said distal rung and said magnetic core for coupling magnetic flux from said distal rung to said magnetic core having a direction related to said digital data value;
      iv. an input addressing wire magnetically coupled to said addressing rung for selectively controlling coupling of said input flux signal at said input rung to said distal rung for coupling by said enabling wire; and
   C. an output element magnetically coupled to said magnetic core that detects transitions in magnetic flux in said magnetic core.

8. A storage element as defined in claim 7 in which said output element includes an output addressing portion comprising:
   i. a laddic-shaped output addressing element having a plurality of rungs including an input rung, at least one output addressing rung, and an output rung,
   ii. an input wire magnetically coupled to said magnetic core and said input rung for generating an input flux signal in said output addressing element;
   iii. an output wire magnetically coupled to said output rung; and
   iv. an output addressing wire magnetically coupled to said output addressing rung for selectively controlling coupling of said input flux signal at said input rung to said output rung for coupling by said output wire.

9. A storage element as defined in claim 8 in which said output addressing element includes a plurality of output addressing rungs, said output addressing portion including a like plurality of output addressing wires each magnetically coupled to one of said output addressing rungs for selectively controlling coupling of said input flux signal at said input rung of said output addressing element to its output rung.

10. A storage element as defined in claim 9 wherein each said input addressing element includes a plurality of input addressing rungs, said input addressing portion including a like plurality of input addressing wires each magnetically coupled to one of said input addressing rungs for selectively controlling coupling of said input flux signal at said input rung to said enabling rung.

11. A storage element as defined in claim 10 wherein at least some of said input addressing wires are associated with respective ones of said output addressing wires.

12. An addressable storage device comprising:
   A. a magnetic element including a pair of sidebars and a plurality of rungs extending therebetween and magnetically coupled to said sidebars from an input end to a far end, each pair of rungs defining a window, said magnetic element including an input rung and a distal rung at opposing ends of said sidebars and addressing rungs therebetween;
   B. input means including input wire means magnetically connected to said input rung for applying an input signal to generate input magnetic flux in said input rung having a direction related to a digital data value;
   C. a plurality of address wires around separate ones of said addressing rungs from said input rung to said distal rung, said address wires being wound around said rungs and selectively receiving current to generate magnetic flux in said addressing rungs to selectively facilitate coupling of said input magnetic flux from said input end to said distal rung in response to a selected encoding of address signals applied to said address wires, the level of said current and the respective dimensions and materials of the addressing rungs, said input rung, said distal rung and said sidebars being selected so that the flux generated in the addressing rungs substantially saturates the addressing rungs, but not the input rung, the distal rung and the sidebars; and
   D. output wire means magnetically connected to said distal rung for generating an output signal in response to changes in magnetic flux in said distal rung.

13. An addressable storage device as defined in claim 12 further comprising:
   A. a core of magnetic material; and B. coupling means for coupling changes in magnetic flux at said distal rung to said core so that changes in the magnetization of said distal rung resulting from said input signal are reflected in changes in the magnetization of said core.

14. An addressable storage device as defined in claim 13 in which said coupling means comprises a wire magnetically coupled to both said end rung and said core, so that changes in said magnetization of said far end resulting in generation of an electrical pulse in said wire whose magnitude and direction are associated with the change in magnetization, said electrical pulse further generating magnetic flux in said core.

15. A digital data storage element comprising:
   A. a magnetic core;
   B. a plurality of input addressing portions each comprising:
      i. a laddic-shaped input addressing element having a pair of sidebars and plurality of rungs including an input rung, a plurality of input addressing rungs, and a distal rung;
      ii. an input wire magnetically coupled to said input rung for generating an input flux signal in said addressing element having a direction related to a digital data value;
      iii. an input coupling means magnetically coupled to said distal rung and said magnetic core for coupling magnetic flux from said distal rung to said magnetic core having a direction reflecting said digital data value;
      iv. a plurality of input addressing wires each magnetically coupled to an input addressing rung for selectively receiving current to generate magnetic flux in said addressing rungs to control coupling of said input flux signal at said input rung to said distal rung for coupling by said input coupling means; and
   C. a plurality of output addressing portions each comprising:
      i. a laddic-shaped output addressing element having a pair of sidebars and plurality of rungs including an input rung, a plurality of output addressing rungs, and an output rung;
      ii. an output coupling means magnetically coupled to said core and to said input rung for generating in input flux signal in said input rung of said output addressing element;
      iii. an output line magnetically coupled to said output rung of said output addressing element; and
      iv. a plurality of output addressing wires each magnetically coupled to an output addressing rung for selectively receiving current to generate magnetic flux in said output addressing rungs to control coupling of said input flux signal at said input rung to said output rung for coupling by said output wire.

16. A storage element as defined in claim 15 in which said input coupling means comprises a wire magnetically coupled to both said distal rung of said input addressing element and said core.

17. A storage element as defined in claim 15 in which said output coupling means comprises a wire magnetically coupled to both said core and said input rung of said output addressing element.

18. A storage element as defined in claim 15 in which the number of input addressing portions corresponds to the number of output addressing portions.

* * * * *